(12) United States Patent
Bui

(10) Patent No.: US 12,126,333 B1
(45) Date of Patent: Oct. 22, 2024

(54) ELECTRICAL CIRCUIT FOR SWITCHING BIAS VOLTAGE OF BONDING PAD AND ELECTRONIC DEVICE HAVING THE ELECTRICAL CIRCUIT

(71) Applicant: Winbond Electronics Corp., Taichung (TW)

(72) Inventor: John H. Bui, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 24 days.

(21) Appl. No.: 18/193,636

(22) Filed: Mar. 31, 2023

(51) Int. Cl.
*H03K 17/687* (2006.01)
*G11C 16/30* (2006.01)
*G11C 16/32* (2006.01)
*H03K 19/20* (2006.01)

(52) U.S. Cl.
CPC .......... *H03K 17/687* (2013.01); *G11C 16/30* (2013.01); *G11C 16/32* (2013.01); *H03K 19/20* (2013.01)

(58) Field of Classification Search
None
See application file for complete search history.

(56) References Cited

U.S. PATENT DOCUMENTS

| 6,552,583 B1* | 4/2003 | Kwong | H01L 27/0285 361/111 |
| 7,180,331 B2* | 2/2007 | Gosmain | H03K 19/00315 326/86 |
| 8,619,482 B1* | 12/2013 | Bui | G11C 7/04 365/189.11 |
| 10,643,685 B1 | 5/2020 | Yu et al. | |

FOREIGN PATENT DOCUMENTS

| CN | 105097786 | 5/2019 |
| TW | I614748 | 2/2018 |

* cited by examiner

*Primary Examiner* — Jeffrey S Zweizig
(74) *Attorney, Agent, or Firm* — JCIPRNET

(57) ABSTRACT

In an aspect, the disclosure is directed to an electrical circuit which includes not limited to: a first bonding pad having a bias voltage, a voltage pull-up circuit configured to set the bias voltage of the first bonding pad to a high voltage, a voltage pull-down circuit configured to switch bias voltage of the first bonding pad from the high voltage to a low voltage in response to the voltage pull-down circuit receiving a first control signal which activates the voltage-pull down circuit, a rise time delay control circuit configured to control a rise time of the bias voltage of the first bonding pad, wherein the bias voltage of the first bonding pad starts to rise in response to the first control signal deactivating the voltage pull-down circuit, and a driving circuit configured to drive a second control signal to activate the driving circuit.

20 Claims, 6 Drawing Sheets

ELECTRICAL CIRCUIT FOR SWITCHING BIAS VOLTAGE OF BONDING PAD AND ELECTRONIC DEVICE HAVING THE ELECTRICAL CIRCUIT

TECHNICAL FIELD

The disclosure is directed to an electrical circuit configured to switch bias voltages of a bonding pad and an electronic device having the electrical circuit.

BACKGROUND

Given a strong demand of a high-density NOR flash memory for automobile and electronic devices, attempts have been made by memory suppliers to raise the density of NOR flash memory devices by putting two or more memory dies in a single package so as to increase the memory density of NOR flash memory devices.

FIG. 1 illustrates a memory device single package 100 having multiple stacked-dies 101~104. Among the dies 101~104, there could be global control signals (e.g. GS1 GS2) on global control signaling lines that are connected together through inter-die bonding pads in order to implement a global control function. For a memory device, the global control signals could be, for example, a global busy signal, a global suspension signal, and etc. An inter-die bonding pad could be a weak pull-up I/O pad that is connected to an electrical circuit to facilitate fast switching of bias voltages to order to implement the control signal on the electrical connection associated with the bonding pad.

However, the electrical circuit connected to the bonding pad for switching bias voltages of the bonding pad may have two problems. First, each bonding pad could be connected to a power supply (e.g. Vcc) voltage through a pull-up resistor which would consume current. To alleviate such problem, the value of the resistance has to be made large. However, the increase of the resistance cannot be unlimited since the pull-up resistance would lead to an increased RC time constant of the pad. Second, each bonding pad has a certain amount of capacitance contributing to a higher charge time. The two problems described above could be made worse if there are a number of bonding pads connected together. Each additional pad would lead to a proportional increase of capacitance leading to an increase charge time of the pads due to the RC time constant. Further, each additional pad would contribute to a current consumption which could be larger and large as the number of pads increases.

In the example of FIG. 1, exceedingly large values pull-up resistors may not be able to pull up the voltage of the pads fast enough to achieve high performance, but it would consume less current when the pad is pulled low. On the other hand, small values of resistors may speed up the rise time delay of the bias voltage of the pads, but it would consume more current. Assuming that the current limit for each bonding pad is 1 uA, the basic equation I=C*dv/dt could be used to estimate the typical rise time for 4 pads, each having 1 uA current, to pull-up 12 pF capacitance of the Pads to half of the Vcc level, and the rise time for 4 pads is around 2700 nS. Since such number does not come close to meeting high performance which may require the rise time to be less than 100 nS, in order to satisfy the rise time target of 100 ns, the total pull up current would need to be greater than 108 uA which is significant.

Another potential concerns with slower pulling up of the bias voltage of the bonding pads is that the input signal for each bonding pad could be more susceptible to coupling noises from other near-by signals or from the power supply, and such coupling noises may trigger the input receiver unintendedly.

In order to alleviate the difficulties described above, an electrical circuit configured to switch bias voltages of a bonding pad would need to be designed in a way that is low current and high speed and immune to noises.

SUMMARY OF THE DISCLOSURE

Accordingly, in order to resolve the above-described challenge, the disclosure is directed to an electrical circuit configured to switch bias voltages of a bonding pad, and an electronic device having the electrical circuit.

In an aspect, the disclosure is directed to an electrical circuit which includes not limited to: a first bonding pad having a bias voltage, a voltage pull-up circuit electrically connected to the first bonding pad and configured to set the bias voltage of the first bonding pad to a high voltage, a voltage pull-down circuit electrically connected to the first bonding pad and the voltage pull-up circuit and configured to switch bias voltage of the first bonding pad from the high voltage to a low voltage in response to the voltage pull-down circuit receiving a first control signal which activates the voltage-pull down circuit, a rise time delay control circuit electrically connected to the first bonding pad and the voltage pull-down circuit and configured to control a rise time of the bias voltage of the first bonding pad, wherein the bias voltage of the first bonding pad starts to rise in response to the voltage pull-down circuit receiving the first control signal which deactivates the voltage pull-down circuit, and a driving circuit electrically connected to the first bonding pad and the rise time delay control circuit and configured to drive a second control signal in response to the bias voltage of the first bonding pad starts to rise so as to activate the driving circuit.

In an aspect, the disclosure is directed to an electronic device which includes not limited to: a plurality of dies connected together through multiple interconnecting bonding pads which comprise a first bonding pad having a bias voltage, a voltage pull-up circuit electrically connected to the first bonding pad and configured to set the bias voltage of the first bonding pad to a high voltage, a voltage pull-down circuit electrically connected to the first bonding pad and the voltage pull-up circuit and configured to switch bias voltage of the first bonding pad from the high voltage to a low voltage in response to the voltage pull-down circuit receiving a first control signal which activates the voltage-pull down circuit, a rise time delay control circuit electrically connected to the first bonding pad and the voltage pull-down circuit and configured to control a rise time of the bias voltage of the first bonding pad, wherein the bias voltage of the first bonding pad starts to rise in response to the voltage pull-down circuit receiving the first control signal which deactivates the voltage pull-down circuit, and a driving circuit electrically connected to the first bonding pad and the rise time delay control circuit and configured to drive a second control signal in response to the bias voltage of the first bonding pad starts to rise so as to activate the driving circuit.

DETAILED DESCRIPTION OF DISCLOSED EMBODIMENTS

The electrical circuit provided in this disclosure is not limited to be used in NOR flash memory device only, but the disclosure could be implemented in any device that has one or more weak pull-up bonding pads that demands low current consumption and fast switching in order to achieve a high performance. Further, the disclosure may also be applicable to a device that has just a single die in its package. Such exemplary embodiment is specifically described in FIG. 5 and its corresponding written descriptions.

Figure 1:
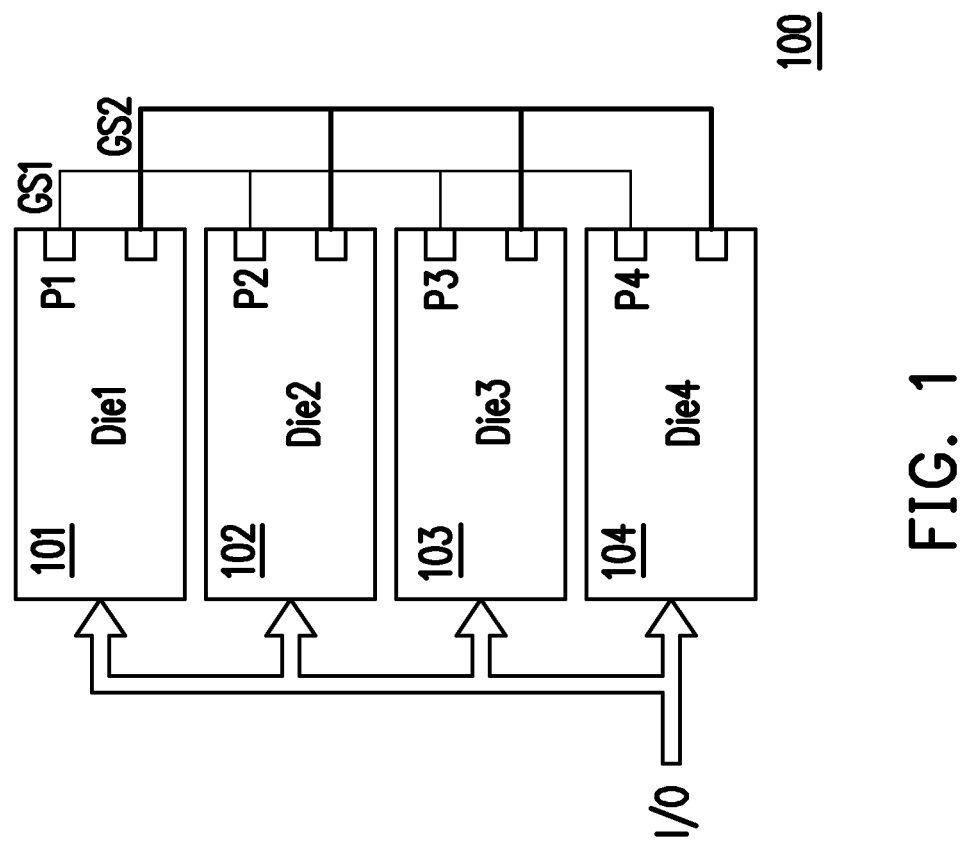
FIG. 1 illustrates a single package containing multiple interconnected dies through bonding pads.
Figure 2:
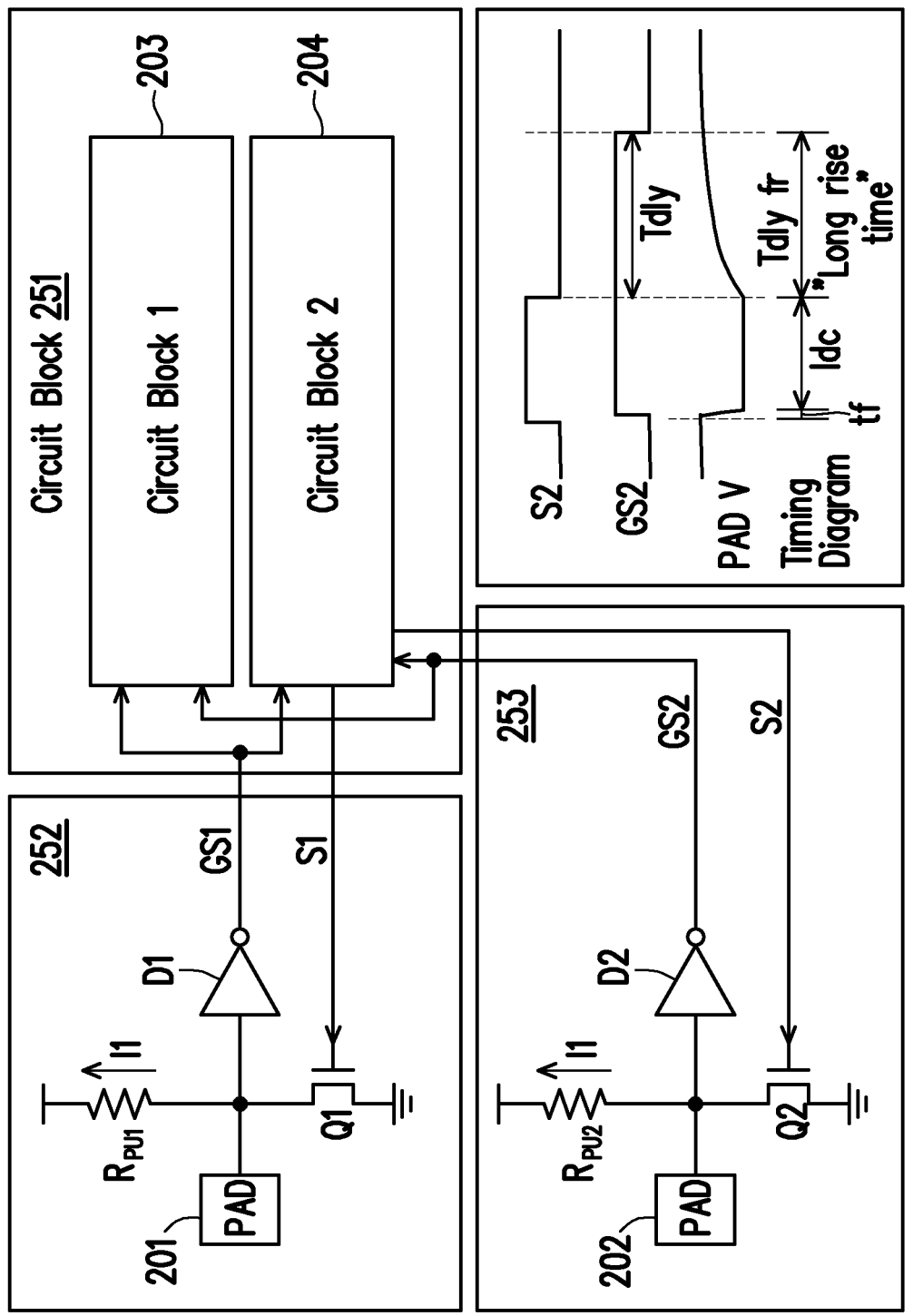
FIG. 2 illustrates an electrical circuit configured to switch bias voltages of a bonding pad according to a first exemplary embodiment of the disclosure.

As described previously, placing multiple stacked dies into the same package of an electronic memory device such as a flash memory device would require inter-die bonding pads for implementing global signaling as shown previously in FIG. 1. Further, the inter-die bonding pads would require electrical circuits for providing bias voltages on the bonding pads and for the switching of the bias voltages. An example of an electrical circuit 200 configured for providing and for switching the bias voltages of one or more bonding pad is shown in FIG. 2. Assuming that the electrical circuit 200 has at least two bonding pads including a first bonding pad 201 and a second bonding pad 202, the first bonding pad 201 could be used for connecting to a first global control signal which is electrically connected to all the dies in the same package of the electronic device through their respective bonding pads, and the second bonding pad 202 could be used for connecting to a second global signal in a similar manner. The first global signal could be, for example, a global busy signal, and the second global signal could be, for example, a global suspend signal. However, the global signals of the disclosure are not limited to these above examples.

The first electrical circuit 252 and the second electrical circuit 253 are connected to the rest of the memory circuit of a memory device represented by the circuit block 251. In the same of FIG. 2, the first electrical circuit 252 is connected to a first circuit block 203 and the second electrical circuit 253 is connected to a second circuit block 204. The first circuit block 203 and the second circuit block 204 could be on the same die or on different dies. Also, the first circuit block 203 and the second circuit block 204 could be the same circuit block as this disclosure does not limit as such.

For the first bonding pad 201, it is controlled by a first electrical circuit 252 configured to provide and to switch the bias voltage of the first bonding pad 201, and the second bonding pad 202 is controlled by the second electrical circuit 253 in a similar manner. For the first electrical circuit 252, there are at least three functional elements including a voltage pull-up circuit, a voltage pull-down circuit, and a driving circuit. The voltage pull-up circuit could be implemented by the pull-up resistor $R_{PU}1$ which connects between the bonding pad and a high voltage which could be Vcc or power supply voltage. The function of the voltage pull-up circuit is to set the first bonding pad 201 to the high voltage. The voltage pull-down circuit is connected to the first pad 201 and the pull-up resistor $R_{PU}1$ and could be implemented by a NMOS transistor Q1 connected to a low voltage which could be a ground voltage or a Vss voltage. When Q1 is activated by, for example, the first control signal S1 of the second circuit block 204 of the circuit block 251, Q1 pulls the bias voltage of the first pad 201 from a high voltage to a low voltage as shown by PAD V of timing diagram of FIG. 2. When Q1 is deactivated by S1, PAD V slowly rises. The driving circuit D1 could be implemented by a driving inverter. As PAD V is pulled low, the driving circuit D1 would output a high voltage to drive the second control signal, GS1. The first control signal S1 could be a local control signal that controls the die in which the first electrical circuit 252 is located, and the second control signal GS1 could be a global control signal that controls all the dies situated in the same package.

As for the second electrical circuit 253, in includes a second pad 202, the pull-up resistor $R_{PU}2$, another NMOS transistor Q2, another driving circuit D2, a local control signal S2, and another global control signal GS2. The functions of the second electrical circuit 253 are the same as the first electrical circuit 252 and thus a repetition of its description is not necessary.

Figure 4:
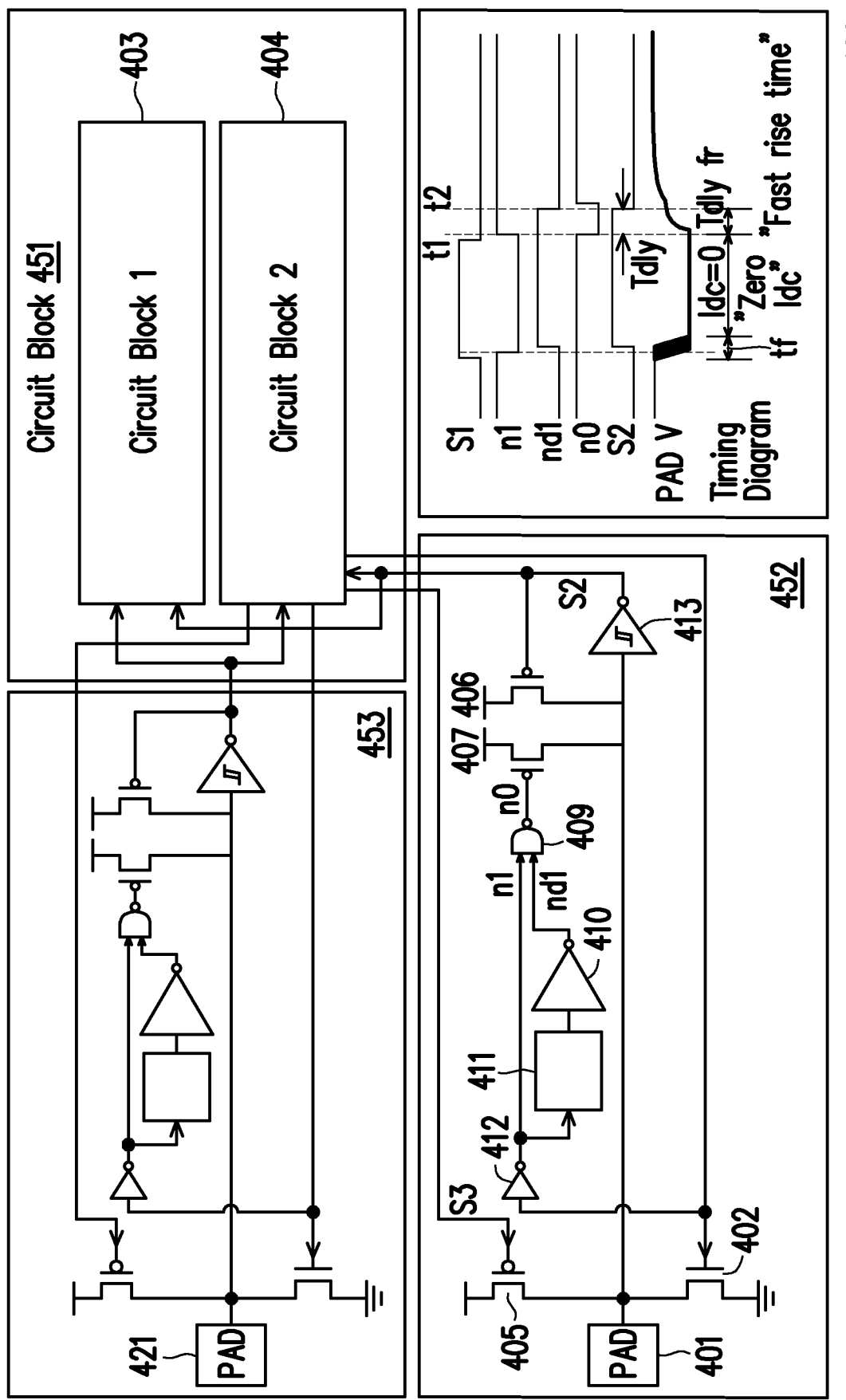
FIG. 4 illustrates an electrical circuit configured to switch bias voltages of a bonding pad according to a second exemplary embodiment of the disclosure.
Figure 5:
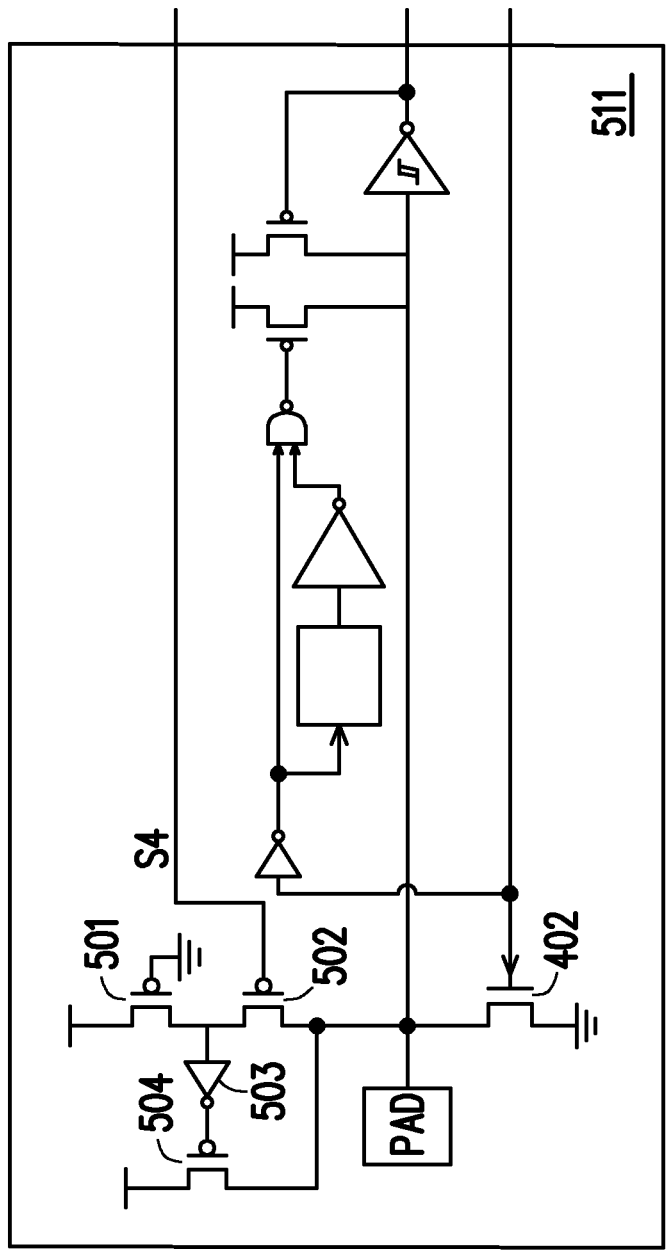
FIG. 5 illustrates an electrical circuit configured to switch bias voltages of a bonding pad according to a third exemplary embodiment of the disclosure.

In FIG. 2, as the resistors $R_{PU}1$ $R_{PU}2$ affect the current I1 and I2, the resistors cannot be too small since it would lead to a high current consumption even though small value resistors may speed up the delay rise time (tdly_fr) of PAD V when it is pulled up. However, the resistors that are exceedingly large value resistor may not be able to pull up the bonding pads 201, 202 fast enough for high performance. Therefore, FIG. 3~FIG. 5 shows exemplary embodiments that would improve upon the embodiment of FIG. 2.

Figure 3:
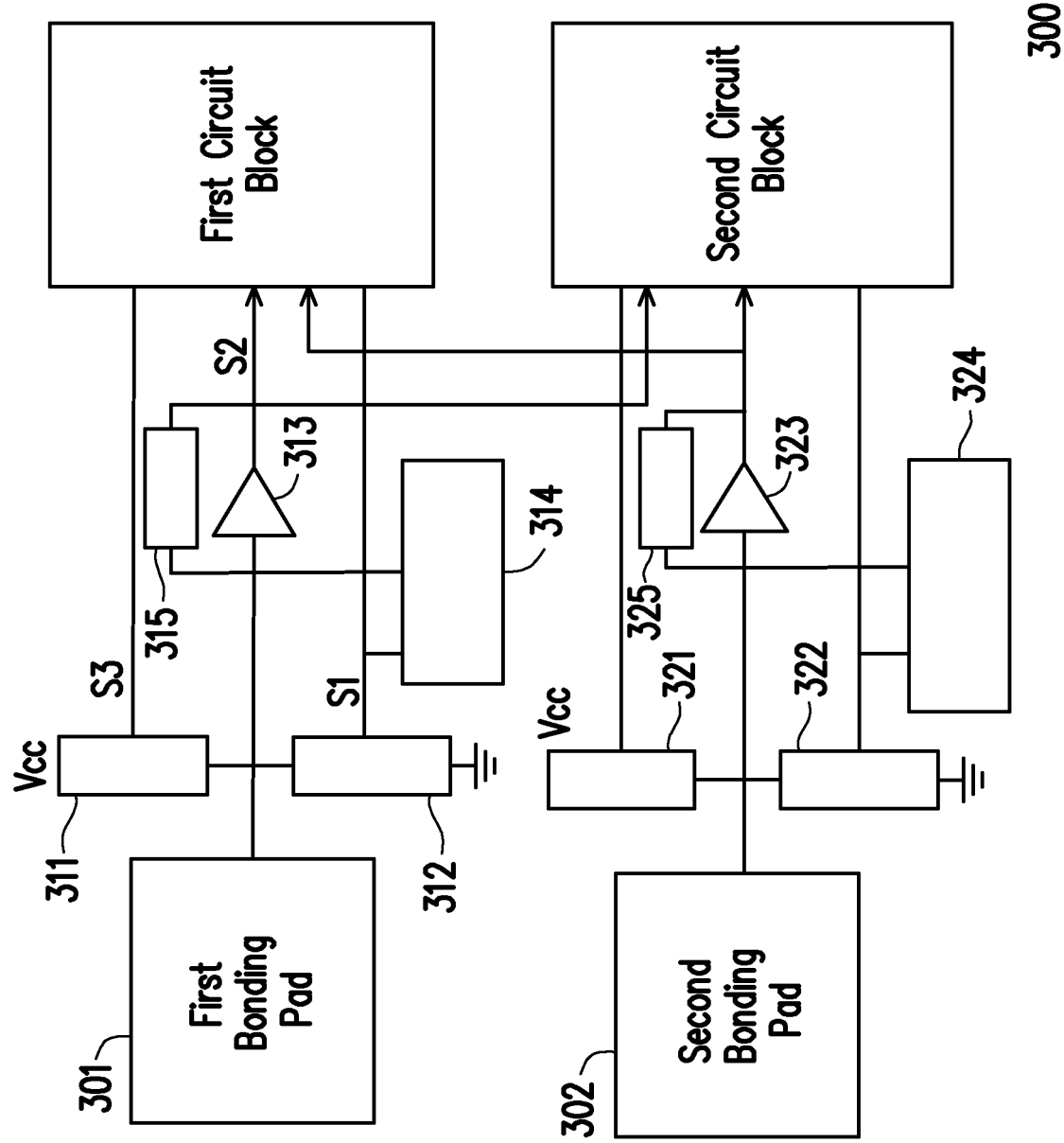
FIG. 3 illustrates a block diagram of an electrical circuit configured to switch bias voltages of a bonding pad.

The main inventive concept of the disclosure is shown in FIG. 3 in terms of a block diagram. Referring to FIG. 3, it shows the electrical circuit 300 configured to switch bias voltages of a bonding pad. The electrical circuit 300 includes not limited to a first bonding pad 301 having a bias voltage (e.g. PAD V), a voltage pull-up circuit 311 electrically connected to the first bonding pad 301 and configured to set the bias voltage of the first bonding pad 301 to a high voltage (e.g. Vcc), a voltage pull-down circuit 312 electrically connected to the first bonding pad 301 and the voltage pull-up circuit 311 and configured to switch bias voltage of the first bonding pad 301 from the high voltage (e.g. Vcc) to a low voltage (e.g. Gnd or Vss) in response to the voltage pull-down circuit 312 receiving a first control signal S1 which activates the voltage-pull down circuit 312, a rise time delay control circuit 314 electrically connected to the first bonding pad 301 and the voltage pull-down circuit 312 and configured to control a rise time (e.g. Tdly_Fr) of the bias voltage of the first bonding pad 301, wherein the bias voltage of the first bonding pad 301 starts to rise in response to the voltage pull-down circuit 312 receiving the first control signal S1 which deactivates the voltage pull-down circuit 312, and a driving circuit 313 electrically connected to the first bonding pad 301 and the rise time delay control circuit 314 and configured to drive a second control signal S2 in response to the bias voltage of the first bonding pad 301 starts to rise so as to activate the driving circuit 313.

The voltage pull-up circuit 311 may include a first transistor (e.g. 405) having a first terminal connected to the high voltage (e.g. Vcc), a second terminal configured to receive a third control signal S3, and a third terminal connected to the voltage-pull down circuit 312, wherein in response to the bias voltage of the first bonding 301 pad having been switched from the high voltage to the low voltage, the first transistor (e.g. 405) has no current between the first terminal and the third terminal. The second terminal of the first transistor (e.g. 405) is a gate terminal configured to receive the third control signal S3 which is a (power on) reset signal and turns on the first transistor (e.g. 405) to pull up the bias voltage of the first bonding pad 301 to the high voltage during a reset period and turns off the first transistor (e.g. 405) after the reset period to enter a normal operation.

The voltage pull-down circuit 312 may include a second transistor (e.g. 402) having a first terminal connected to the voltage pull-up circuit 311, a second terminal configured to receive the first control signal S1, and a third terminal connected to the low voltage. In response to the first control signal S1 de-activates the voltage pull-down circuit 312, the bias voltage of the first bonding pad 301 remains high unless the first bonding pad 301 is pulled low by another inter-die bonding pad from another die.

The driving circuit 313 may include a driving inverter (e.g. 413) having a first terminal connected to the voltage pull-up circuit 311, the first bonding pad 301, and the voltage-pull down circuit 312 and a second terminal configured to drive the second control signal S2. In response to the bias voltage of the first bonding pad 301 falling below a threshold voltage of the driving circuit 313, the second terminal of the driving circuit 313 outputs a high voltage for the second control signal S2.

The driving circuit 313 may further include a third transistor (e.g. 406) having a first terminal connected to the high voltage, a second terminal connected to the second terminal of the driving circuit 313, and a third terminal connected to the first terminal of the driving circuit 313. In response to the third control signal or the reset signal S3 that turns on the first transistor (e.g. 405) to pull up the bias voltage of the first bonding pad 301 to the high voltage during the reset period, the third resistor (e.g. 406) is turned on by the driving inverter (e.g. 413) to also pull up the bias voltage of the first bonding pad 301 to the high voltage, and after the reset period, the third transistor (e.g. 406) is turned off during the normal operation allowing the bias voltage of the first bonding pad 301 to fall toward the low voltage.

The driving inverter (e.g. 413) could be implemented by using a Schmitt trigger inverter. The first control signal could be a signal that controls a single die. However, if a package contains multiple dies, the second transistor (e.g. 402) pulling down one pad may lead to all inter-die pads being pulled down from high to low. The second control signal could be a signal that is capable of controlling multiple dies simultaneously (i.e. a global control signal).

The rise time delay control circuit 314 may include a fourth transistor (e.g. 407) having a first terminal connected to the high voltage, a second terminal configure to receive a pulse signal, and a third terminal connected to the first bonding pad 301 and the driving circuit 313. The fourth transistor (e.g. 407) is configured to control the rise time of the bias voltage of the first bonding pad 401 based on the pulse signal. The rise time delay control circuit is configured to generate the pulse signal and further includes a first inverter (e.g. 412), a delay setting circuit (e.g. 411), a second inverter (e.g. 410), and a NAND gate (e.g. 409). The first inverter (e.g. 412) is connected to an input of the delay setting circuit (e.g. 411) and a first input terminal of the NAND gate (e.g. 409), an output of the rise time delay setting circuit 314 is connected to an input of the second inverter (e.g. 410), an output of the second inverter (e.g. 410) is connected to a second input of the NAND gate (e.g. 409), and the NAND gate (e.g. 409) performs a NAND operation to generate the pulse signal.

The first inverter (e.g. 412) may outputs a first signal (e.g. n1) and the second inverter (e.g. 410) may output a second signal (e.g. nd1) which is delayed by a time delay period (e.g. Tdly) relative to the first signal (e.g. n1). The delay setting circuit (e.g. 411) may include a chain of inverters which, in combination with the second inverter, set the time delay period (e.g. Tdly). In response to the first control S1 activating the voltage pull-down circuit 312, the first signal (e.g. n1) is set low and the second signal (e.g. nd1) is set high so that the NAND gate (e.g. 409) outputs a high signal. In response to the first control signal (S1) deactivating the voltage pull down circuit 412 at a first time point, the bias voltage of the first pad 301 rises according to a rate which is proportion to a duty cycle of the pulse signal.

After the first control signal is pulled low to deactivate the voltage pull down circuit 312 at a first time point (e.g. t1), the second control signal S2 is driven low by the driving circuit 313 at a second time point (e.g. t2), and the time delay period (Tdly) is a difference between the first time point (e.g. t1) and the second time point (e.g. t2).

The electrical circuit may also include a second bonding pad 302, as each of the first bonding pad 301 and the second bonding pad 302 is electrically connected to different dies. Alternatively, the first bonding pad 301 could be only connected to a single die. In that case, the voltage pull-up circuit 311 would further include a fifth transistor (e.g. 502) as a first terminal of the fifth transistor (e.g. 502) is connected to the first transistor, a second terminal of the fifth transistor (e.g. 502) is connected to a fourth control signal S4 which is a pull-up enable signal, and a third terminal of the fifth transistor (e.g. 502) is connected to the first bonding pad 301 and the voltage pull-down circuit 312. The voltage pull-up circuit 311 may further includes a third inverter (e.g. 503) having a first terminal which is connected to the first terminal of the fifth transistor (e.g. 502), and a sixth transistor (504) connected to a second terminal of the third inverter (503).

Lastly, it should be noted that the functions of elements 321, 322, 323, 324, and 325 could be identical to elements 311, 312, 313, 314, and 315 and thus a repetition of the written description is not repeated.

To further elucidate the inventive concept of FIG. 3, FIG. 4 shows the electrical circuit configured to switch bias voltages of a bonding pad in terms of a circuit diagram. The electrical circuit 400 of FIG. 2 include at least two electrical circuits 452, 453 for implementing the bias voltage control of different bonding pads 401, 421. The description of FIG. 4 describes the functions of the first electrical circuit 452, but the functions of the second electrical circuit 453 are identical to the first electrical circuit 452 and thus only the functions of the first electrical circuit 452 is described. Furthermore, electrical circuit 400 may also have just one bonding pad, either 401 or 421. For such embodiment, the voltage pull-up circuit (e.g. 311) is to be modified, and the details of the modification is described in the embodiment of FIG. 5.

In comparison to FIG. 4, the DC current of the bonding pad 401 could be reduced to zero by replacing the pull-up resistor $R_{PU}1$ with transistor 405. The transistor 407 is a strong PMOS pull-up transistor controlled by an auto short-negative-pulse (high to low to high and so forth) generator. The transistor 406 is a weak PMOS transistor controlled by the output of an inverter driver 413 which could be a Schmitt inverter buffer used to enhance input noise immunity. Ideally, the transistor 405 has a small channel width (Wp) size which could be just strong enough to keep the bias voltage of the bonding pad 401 out of floating state and still be able to pull the bias voltage of the bonding pad 401 up high during a power up event.

During a power up event, the power-on-reset period begins. During such event, the control signal S3 which is a power-on-reset signal is driven low by the circuit block 404, which could be a logical circuit, to enable the transistor 405 to pull the bias voltage of the bonding pad 401 to a high voltage (e.g. Vcc). As the bias voltage of the bonding pad 401 exceeded above a threshold of the Schmitt inverter buffer 413, the output of the Schmitt inverter buffer 413 switches from a high voltage to a low voltage which enables the PMOS transistor 406 to pull the bias voltage of the bonding pad 401 to the level of the high voltage (Vcc). As shown in the timing diagram of FIG. 4, the bias voltage of the bonding pad, PAD V, is initially high while the first control signal S1 and the second control signal S2 are initially low. After the power-on-reset period is completed, the circuit block 404 would set the third control signal S3 to high which would turn off the transistor 405 to disconnect the bonding pad 401 from the high voltage (e.g. Vcc) before commencing the normal phase.

During the normal phase, when the circuit block 404 switches the first control signal S1 from a low voltage to a high voltage, the transistor 402 is turned on to pull the bias voltage of the bonding pad 401 toward a low voltage (e.g. Vss or ground). As the bias voltage of the bonding pad 401 falls past the threshold voltage of the Schmitt inverter buffer 413, the output of the Schmitt inverter buffer 413 switches from a low voltage to a high voltage to turn off the transistor 406. After the transistors 405, 406 are both turned off, the bias voltage of the bonding pad 401 would begin a free fall toward the low voltage (e.g. ground) as long as the first control signal S1 has been activated and remain at the high voltage. However, as seen in the timing diagram of FIG. 4, after the first control signal S1 is switched back from high to low by the circuit block 404, the bias voltage of the pad 401 is brought back to a high voltage. The speed that the bias voltage of the pad 401 is brought back to the high voltage is based on a rise time (Tdly_fr) which is controlled by the inverter 412, the delay setting circuit 411, the inverter 410, the NAND gate 409, and the transistor 407 which are a part of the rise time delay control circuit (e.g. 314, 324).

The rise time (Tdly_fr) is directly proportional to the frequency of the transistor 407 being in an on state as well as the duty cycle of the on state. The frequency and the duty cycle of the on state of the transistor 407 is controlled based on the delay set by the rest of the rise time delay control circuit (e.g. 314, 324). Essentially, when the first control signal S1 is set high, the high voltage from the first control signal S1 is flipped low by the inverter 412 to be output by the inverter 412 as the n1 signal without any delay. However, the output of the inverter 412 is also sent to the delay setting circuit 411 and the inverter 410 to be outputted as the nd1 signal which has delays. The total delay (i.e. time delay period shown as Tdly in FIG. 4) is determined by the delay setting circuit 411 which could be implemented by using a chain of an even number of inverters as the delay of each of the chain of inverters could be known in advance. In this way, assuming that the first signal S1 is set low which causes the n1 signal to be set high at a first time point t1, total delay would cause the signal nd1 to be flipped by the inverter 410 at the second time point t2. The time difference between the first time point t1 and the second time point t2 is the time delay period Tdly. The NAND gate 409 would subsequently perform a NAND operation of the signal n1 and the signal nd1 to generate the signal n0 which would be used to control the on state of the transistor 407. Consequently, as shown in FIG. 4, the bias voltage of the bonding pad 401 would start to rise when the transistor 407 is turned on, and the duty cycle of the signal n0 would determine the rise time (Tdly_fr) fp the bias voltage of the bonding pad 401. The electrical circuit 453 which controls the bias voltage of the bonding pad 421 would operate in the same way.

Since the transistor 407 is only turned on for a short period of time, large transistor channel size (Wp) can be implemented to speed up the rise time (Tdly_fr) to achieve a high performance. Based on the channel size of the transistor 407, designers could be able to optimize the delay setting circuit 411 by approximating the value of the current (Ipu) of the transistor 407, and then use the current (Ipu) value to calculate the delay time required to pull-up the bias voltage of the bonding pad 401. As the larger the transistor size is chosen, the shorter the time delay period (Tdly) in the delay setting circuit 411 is needed, and the faster the rise time of the bias voltage of the bonding pad 401 is achieved.

The transistor 406 is introduced to speed up the rise or fall time of the bias voltage of the bonding pad 401 in order to avoid potential glitches right after the Schmitt inverter buffer 413 has switched the polarity of its output voltage so as to maintain the bias voltage of the bonding pad 401 at a high voltage or Vcc rail when needed. The size of the transistor 406 could be controlled so that it is strong enough to maintain the PAD at a high voltage or Vcc rail when control signal S1 is not asserted. When the control signal S1 is asserted high, the bias voltage of the bonding pad 401 is driven to low by transistor 402. As the bias voltage of the bonding pad 401 goes down, the output of the Schmitt inverter buffer 413 is switched from low to high to turn off the pull-up transistor 406. Subsequently, the bias voltage of the bonding pad devoid of any pull-up voltage falls faster, and the direct current path from Vcc to Vss or (ground) is cut off so that the "Zero" DC current can be realized.

The Schmitt inverter buffer 413 is used to enhance input noise immunity. In addition to prevent a false triggering of the Schmitt inverter buffer 413, the output of the Schmitt inverter buffer 413 is also connected to the transistor 406 to further speed up both the rate of rise and the rate of falls of the bias voltage of the bonding pad 401.

The embodiment of FIG. 4 could be implemented in a package that only has one die. Under such circumstance, FIG. 5 illustrates an electrical circuit configured to switch bias voltages of a bonding pad located in die of a package which does not include any interconnecting dies. For the exemplary embodiment of FIG. 5, the electrical circuit 511 is substantially identical to the first electrical circuit 452 or the second electrical circuit 453 of FIG. 4 except that the voltage pull-up circuit (e.g. 311) is modified. The voltage pull-up circuit includes a PMOS transistor 501 connected to a NMOS transistor 502 which is connected to the bonding pad. The gate of the NMOS transistor 502 would receive the fourth control signal S4 is also a power-on-reset signal, similar to S3. The source terminal of the PMOS transistor 501 is connected to the drain of the NMOS transistor 502 and an input of an inverter 503. The output of the inverter 503 is connected to the gate terminal of the PMOS transistor 504.

Figure 6:
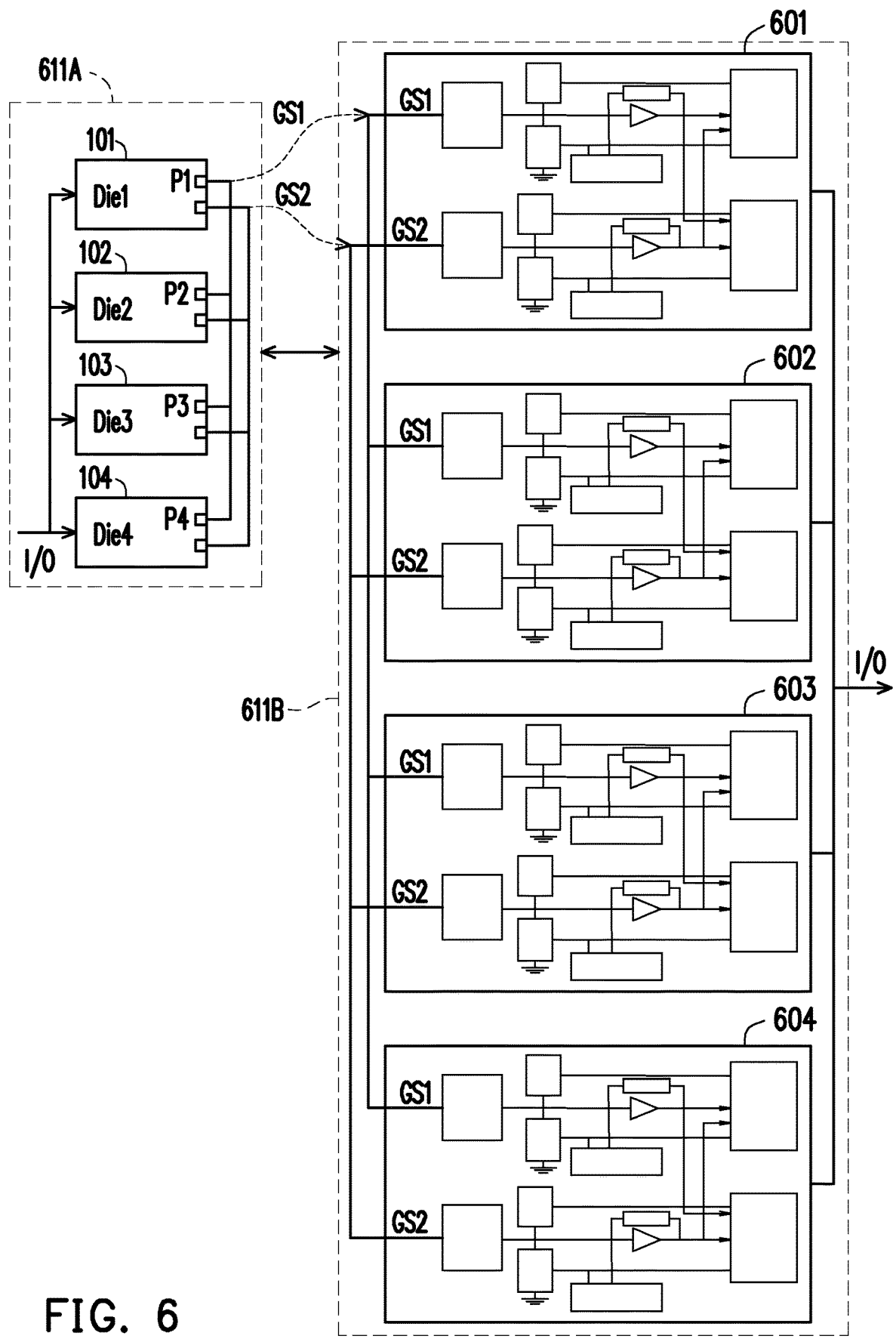
FIG. 6 illustrates the content of each die in the single package of FIG. 1.

FIG. 6 further elucidate the inter-die connections of FIG. 6. As shown in FIG. 6, the device 611 is identical to the single package 100 of FIG. 1. The device 612 is also identical to the single package 100 of FIG. 1 but the content of each die 601 602 603, 603 could be FIG. 3 or any equivalent. Moreover, the first bonding pad (e.g. 301) of the first die 601 is interconnected to all the first bonding pads of other dies 602, 603, 604, and the second bonding pad (e.g. 302) of the second die 602 is interconnected to all the first bonding pads of other dies 602, 603, 604.

What is claimed is:

1. An electrical circuit comprising:
   a first bonding pad having a bias voltage,
   a voltage pull-up circuit electrically connected to the first bonding pad and configured to set the bias voltage of the first bonding pad to a high voltage,
   a voltage pull-down circuit electrically connected to the first bonding pad and the voltage pull-up circuit and configured to switch bias voltage of the first bonding pad from the high voltage to a low voltage in response to the voltage pull-down circuit receiving a first control signal which activates the voltage-pull down circuit,
   a rise time delay control circuit electrically connected to the first bonding pad and the voltage pull-down circuit and configured to control a rise time of the bias voltage of the first bonding pad, wherein the bias voltage of the first bonding pad starts to rise in response to the voltage pull-down circuit receiving the first control signal which deactivates the voltage pull-down circuit, and
   a driving circuit electrically connected to the first bonding pad and the rise time delay control circuit and configured to drive a second control signal in response to the bias voltage of the first bonding pad starts to rise so as to activate the driving circuit.

2. The electrical circuit of claim 1, wherein the voltage pull-up circuit comprises a first transistor having a first terminal connected to the high voltage, a second terminal configured to receive a third control signal, and a third terminal connected to the voltage-pull down circuit, wherein in response to the bias voltage of the first bonding pad having been switched from the high voltage to the low voltage, the first transistor has no current between the first terminal and the third terminal.

3. The electrical circuit of claim 2, wherein the second terminal of the first transistor is a gate terminal configured to receive the third controls signal which is a reset signal and turns on the first transistor to pull up the bias voltage of the first bonding pad to the high voltage during a reset period and turns off the first transistor after the reset period to enter a normal operation.

4. The electrical circuit of claim 3, wherein the voltage pull-down circuit comprises a second transistor having a first terminal connected to the voltage pull-up circuit, a second terminal configured to receive the first control signal, and a third terminal connected to the low voltage, wherein in response to the first control signal de-activates the voltage-pull down circuit, the bias voltage of the first bonding pad remains at the high voltage unless the bias voltage of first bonding pad is pulled down by another bonding pad from another die.

5. The electrical circuit of claim 4, wherein the driving circuit comprises a driving inverter having a first terminal connected to the voltage pull-up circuit, the first bonding pad, and the voltage-pull down circuit and a second terminal configured to drive the second control signal, wherein in response to the bias voltage of the first bonding pad falling below a threshold voltage of the driving circuit, the second terminal of the driving circuit outputs a high voltage for the second control signal.

6. The electrical circuit of claim 5, wherein the driving circuit further comprises a third transistor having a first terminal connected to the high voltage, a second terminal connected to the second terminal of the driving circuit, and a third terminal connected to the first terminal of the driving circuit, wherein in response to the reset signal that turns on the first transistor to pull up the bias voltage of the first bonding pad to the high voltage during the reset period, the third transistor is turned on by the driving inverter to also pull up the bias voltage of the first bonding pad to the high voltage, and after the reset period, the third transistor is turned off during the normal operation allowing the bias voltage of the first bonding pad to fall toward the low voltage.

7. The electrical circuit of claim 5, wherein the driving inverter is a Schmitt trigger inverter.

8. The electrical circuit of claim 1, wherein the first control signal is a signal that controls a single die.

9. The electrical circuit of claim 1, wherein the second control signal is a signal that is capable of controlling multiple dies simultaneously.

10. The electrical circuit of claim 1, where the rise time delay control circuit comprises a fourth transistor having a first terminal connected to the high voltage, a second terminal configure to receive a pulse signal, and a third terminal connected to the first bonding pad and the driving circuit, wherein the fourth transistor is configured to control the rise time of the bias voltage of the first bonding pad based on the pulse signal.

11. The electrical circuit of claim 10, wherein the rise time delay control circuit is configured to generate the pulse signal and further comprises a first inverter, a delay setting circuit, a second inverter, and a NAND gate, wherein the first inverter is connected to an input of the delay setting circuit and a first input terminal of the NAND gate, an output of the delay setting circuit is connected to an input of the second inverter, an output of the second inverter is connected to a second input of the NAND gate, and the NAND gate performs a NAND operation to generate the pulse signal.

12. The electrical circuit of claim 11, wherein the first inverter outputs a first signal and the second inverter outputs a second signal which is delayed by a time delay period relative to the first signal.

13. The electrical circuit of claim 12, wherein the delay setting circuit comprises a chain of inverters which, in combination with the second inverter, set the time delay period.

14. The electrical circuit of claim 12, wherein in response to the first control activating the voltage pull-down circuit, the first signal is set low and the second signal is set high so that the NAND gate outputs a high signal.

15. The electrical circuit of claim 12, wherein in response to the first control signal deactivating the voltage pull down circuit at a first time point, the bias voltage of the first pad rises according to a rate which is proportion to a duty cycle of the pulse signal.

16. The electrical circuit of claim 12, wherein after the first control signal is pulled low to deactivate the voltage pull down circuit at a first time point, the second control signal is driven low by the driving circuit at a second time point, and the time delay period is a difference between the first time point and the second time point.

17. The electrical circuit of claim 1 further comprising a second bonding pad, wherein each of the first bonding pad and the second bonding pad is electrically connected to different dies.

18. The electrical circuit of claim 2, wherein the first bonding pad is only connected to a single die.

19. The electrical circuit of claim 18, wherein the voltage pull-up circuit further comprises:
- a fifth transistor, a first terminal of the fifth transistor is connected to the first transistor, a second terminal of the fifth transistor is connected to a pull-up enable signal, and a third terminal of the fifth transistor is connected to the first bonding pad and the voltage pull-down circuit,
- a third inverter having a first terminal which is connected to the first terminal of the fifth transistor, and
- a sixth transistor connected to a second terminal of the third inverter.

20. An electronic device comprising:
- a plurality of dies connected together through multiple interconnecting bonding pads which comprise a first bonding pad having a bias voltage,
- a voltage pull-up circuit electrically connected to the first bonding pad and configured to set the bias voltage of the first bonding pad to a high voltage,
- a voltage pull-down circuit electrically connected to the first bonding pad and the voltage pull-up circuit and configured to switch bias voltage of the first bonding pad from the high voltage to a low voltage in response to the voltage pull-down circuit receiving a first control signal which activates the voltage-pull down circuit,
- a rise time delay control circuit electrically connected to the first bonding pad and the voltage pull-down circuit and configured to control a rise time of the bias voltage of the first bonding pad, wherein the bias voltage of the first bonding pad starts to rise in response to the voltage pull-down circuit receiving the first control signal which deactivates the voltage pull-down circuit, and
- a driving circuit electrically connected to the first bonding pad and the rise time delay control circuit and configured to providing a second control signal in response to the bias voltage of the first bonding pad starts to rise so as to activate the driving circuit.

* * * * *